(12) United States Patent
Aota

(10) Patent No.: US 7,931,516 B2
(45) Date of Patent: Apr. 26, 2011

(54) ORGANIC LIGHT-EMITTING APPARATUS AND METHOD OF PRODUCING THE SAME

(75) Inventor: Yukito Aota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 371 days.

(21) Appl. No.: 12/170,200

(22) Filed: Jul. 9, 2008

(65) Prior Publication Data

US 2009/0021154 A1 Jan. 22, 2009

(30) Foreign Application Priority Data

Jul. 20, 2007 (JP) .................... 2007-189172
Jun. 18, 2008 (JP) .................... 2008-158961

(51) Int. Cl.
*H01L 51/00* (2006.01)

(52) U.S. Cl. .......................... 445/24; 313/504

(58) Field of Classification Search .......... 313/498–512; 445/24–25
See application file for complete search history.

(56) References Cited

U.S. PATENT DOCUMENTS

| 2004/0137142 A1 | 7/2004 | Nishikawa | 427/66 |
| 2006/0033429 A1* | 2/2006 | Fujimura et al. | 313/509 |
| 2008/0012470 A1* | 1/2008 | Heo et al. | 313/500 |

FOREIGN PATENT DOCUMENTS

| JP | 2002-151254 | 5/2002 |
| JP | 2004-165068 | 6/2004 |

OTHER PUBLICATIONS

Chinese Office Action issued in the Counterpart Application No. 200810133651.2, dated Aug. 14, 2009 (English-Language Translation included)—4 pages.

* cited by examiner

*Primary Examiner* — Anne M Hines
(74) *Attorney, Agent, or Firm* — Fitzpatrick, Cella, Harper & Scinto

(57) ABSTRACT

Provided is an organic light-emitting apparatus in which a crack or the like produced when removing a passivation layer on an external connection terminal is prevented from developing with the elapse of time and the moisture resistance of a light-emitting area is not impaired. The organic light-emitting apparatus includes a substrate; an organic planarization layer for planarizing unevenness of the substrate; an organic light-emitting device including a lower electrode, an organic compound layer, and an upper electrode; and a passivation layer for covering the organic light-emitting device, in which the organic planarization layer has formed therein a recessed or protruding discontinuous portion for dividing a region including a light-emitting area and a region including an external connection terminal, and the discontinuous portion is covered with the passivation layer.

2 Claims, 5 Drawing Sheets

ORGANIC LIGHT-EMITTING APPARATUS AND METHOD OF PRODUCING THE SAME

BACKGROUND OF THE INVENTION

1. Field of the Invention

The present invention relates to an organic light-emitting apparatus used in a flat panel display or the like and a method of producing the same.

1. Description of the Related Art

In recent years, attention has been attracted to an organic light-emitting apparatus, which is a self-emission type device, as a flat panel display. The characteristics of an organic light-emitting device which constitutes an organic light-emitting apparatus are liable to be degraded due to moisture, oxygen or the like. The presence of even a small amount of moisture can result in peeling between an organic compound layer and an electrode layer, which becomes a cause of a dark spot. Therefore, such an organic light-emitting device is covered with an etching glass cover, its periphery is sealed with a sealing agent, and a desiccant is placed inside thereof such that moisture which intrudes through sealed surfaces is absorbed with the desiccant to secure the lifetime of the organic light-emitting device.

However, in order to realize a space-saving flat panel display utilizing a thin organic light-emitting apparatus, the space for a desiccant at the periphery of a light-emitting area needs to be eliminated to further reduce the thickness, and thus, a method of sealing an organic light-emitting apparatus which does not require a large amount of a desiccant is necessary. Therefore, solid sealing with a high-performance passivation layer for preventing intrusion of moisture or oxygen into an organic compound layer is required.

Generally, when a passivation layer is formed, in order to prevent the passivation layer from being formed on an external connection terminal for electrical connection to an electric circuit outside the organic light-emitting device, the external connection terminal and the like are covered with a plate-shaped area mask formed of a metal or the like. However, there has been a problem that deflection of a substrate constituting the organic light-emitting device or deflection of the area mask creates a gap between the substrate and the area mask to form a passivation layer also on the external connection terminal. Accordingly, a method which does not use an area mask has been required and proposed.

Japanese Patent Application Laid-Open No. 2002-151254 describes a method in which a masking tape is applied to a region including an external connection terminal, and after a passivation layer has been formed, the masking tape and the passivation layer are peeled off together. Further, there is also described a method in which an organic compound layer is formed in a region including an external connection terminal, and after a passivation layer has been formed, photoetching is carried out using ultraviolet light to peel off the organic compound layer and the passivation layer together.

Japanese Patent Application Laid-Open No. 2004-165068 describes a method in which a laser elimination layer is formed in a region including an external connection terminal, and after a passivation layer has been formed thereon, laser light is irradiated to remove the laser elimination layer and the passivation layer together.

However, when the passivation layer is peeled to be removed using a masking tape, photoetching, laser irradiation, or blasting, a minute crack, peeling, or the like is produced in a cross section of the passivation layer. These develop due to environment change for a long period of time to reach a light-emitting area, which ultimately impairs the moisture resistance of the passivation layer.

In particular, there are many cases where a passivation layer is formed of silicon nitride, silicon oxynitride, silicon oxide, or the like, and the film thickness is as large as 1 μm to several μm. When such a passivation layer is peeled to be removed, the occurrence rate of cracking is increased.

Further, while an organic light-emitting apparatus including a substrate with a thin-film transistor (TFT) has an organic planarization layer on the TFT, cracks are newly produced in a passivation layer formed on the organic planarization layer due to a temperature change or humidity change. On the other hand, cracks which already exist develop at a higher speed. More specifically, the organic planarization layer will expand and contract due to a change in temperature of the organic light-emitting device. Stress is applied to the organic planarization layer and to the passivation layer including an inorganic material when the organic planarization layer expands or contracts due to a difference in coefficient of expansion. Therefore, the passivation layer formed on the organic planarization layer which already has minute cracks therein yields to the thermal stress and produces new cracks, and the cracks develop with the elapse of time.

SUMMARY OF THE INVENTION

It is, therefore, an object of the present invention to provide an organic light-emitting apparatus in which a crack or the like produced when removing a passivation layer on an external connection terminal is prevented from developing with the elapse of time and the moisture resistance of a light-emitting area is not impaired, and a method of producing the same.

In order to solve the aforementioned problems, the present invention provides an organic light-emitting apparatus, including a substrate, an organic planarization layer for planarizing unevenness of the substrate, an organic light-emitting device including a lower electrode, an organic compound layer, and an upper electrode, and a passivation layer for covering the organic light-emitting device, in which the organic planarization layer has formed therein a recessed or protruding discontinuous portion for separating a region including a light-emitting area and a region including an external connection terminal, and the discontinuous portion is covered with the passivation layer.

According to the present invention, the development of cracking, peeling, or the like produced in a passivation layer when removing a passivation layer on an external connection terminal can be blocked at a discontinuous portion, whereby intrusion of moisture or oxygen into a light-emitting area of an organic light-emitting device can be prevented.

Further features of the present invention will become apparent from the following description of exemplary embodiments with reference to the accompanying drawings.

DESCRIPTION OF THE EMBODIMENTS

Figure 1:
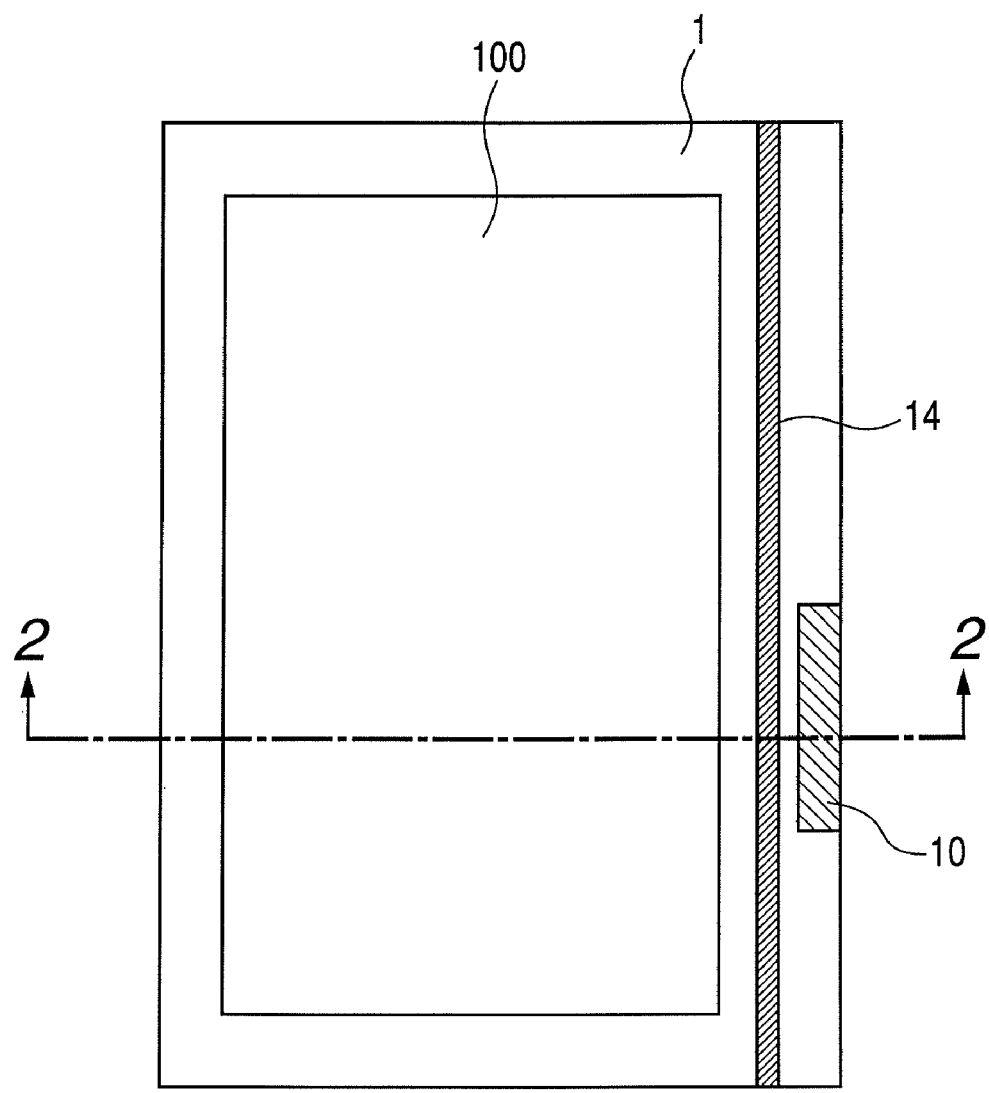
FIG. 1 is a schematic plan view of an embodiment of the organic light-emitting apparatus according to the present invention.

Embodiments of the present invention are now described in the following with reference to the attached drawings. It is to be noted that the present invention is not limited to these embodiments.

Embodiment 1

Embodiment 1 of the present invention is described with reference to FIGS. 1 and 2. FIG. 2 is a schematic cross-sectional view taken along line 2-2 of FIG. 1.

First, a method of producing an organic light-emitting apparatus is described, and then the organic light-emitting apparatus is described.

The method of producing an organic light-emitting apparatus is suitably implemented as a method of producing an organic light-emitting apparatus including at least a substrate 1, an organic planarization layer 4 for planarizing unevenness of the substrate 1, organic light-emitting devices, and a passivation layer 9 which covers the above-mentioned components.

Thin-film transistors 2 for driving respective organic light-emitting devices were formed on the substrate 1. The substrate 1 may be either transparent or opaque, and may be an insulating substrate formed of a synthetic resin or the like, or alternatively, may be a conductive substrate or a semiconductor substrate having an insulating layer of silicon oxide, silicon nitride, or the like formed on a surface thereof.

An insulating layer 3 made of an inorganic material was formed so as to cover the thin-film transistors 2. Further, the organic planarization layer 4 for absorbing the unevenness of the thin-film transistors 2 was formed. As the material of the insulating layer 3, silicon nitride, silicon oxynitride, silicon oxide, or the like may be used. As the material of the organic planarization layer 4, an acrylic resin, a polyimide resin, a norbornene resin, a fluororesin, or the like may be used.

A recessed discontinuous portion 14 for separating a region including a light-emitting area 100 and a region including an external connection terminal 10 as a structure for preventing the cracking of the passivation layer 9 to be formed later was formed in the organic planarization layer 4 in a line parallel to the light-emitting area 100. The term "separation" herein employed means that the passivation layer formed on the external connection terminal 10 and the passivation layer formed in the light-emitting area 100 can be connected to each other only by extending over the discontinuous portion 14. In the organic electroluminescent panel described in Japanese Patent Application Laid-Open No. 2004-165068, because there is a portion where a planarization insulating layer is not formed between a display part and a terminal, there is a possibility that development of cracking, peeling, or the like in such a portion may be decreased. However, because, unlike the apparatus according to the present invention, a discontinuous portion is not formed so as to separate the display part and the terminal, there is a portion where a protective film formed on the terminal and a protective film formed in the display part are connected to each other. It is assumed that, therefore, development of cracking, peeling, or the like is caused.

The discontinuous portion 14 has a protruding structure or a recessed structure. The discontinuous portion 14 can be formed by a known etching method including wet etching and dry etching. For example, a resist is applied by spin coating on the organic planarization layer 4, photolithography is carried out, and after that, immersion in a solution is carried out to remove the organic planarization layer 4. Further, dry etching including plasma etching, sputter etching, and ion beam etching may be used to remove the insulating layer under the organic planarization layer 4.

In the discontinuous portion 14, it is desirable to remove a portion having the entire thickness of the organic planarization layer 4 to thereby expose the insulating layer 3 formed of the inorganic material at the bottom, whereby the adhesion to the passivation layer 9 can be improved.

It is desirable that the side walls of the discontinuous portion 14 are tapered toward the bottom such that the spacing between the opposing side walls is reduced toward the bottom, and the angle (angle of inclination) is 30° or more. The reason is that when the angle is 30° or more, the film density of the passivation layer 9 in the lower portions of the side walls of the discontinuous portion 14, that is, at the corners of the discontinuous portion 14, can be reduced, whereby the continuity of the passivation layer 9 can be broken. Further, when the angle of the side walls of the discontinuous portion 14 is steep, the region at the periphery of the light-emitting area 100, in other words, the frame region, can be made smaller.

It is desirable that the width of the bottom of the discontinuous portion 14 is 0.1 mm or more and 0.5 mm or less. When the width is more than 0.5 mm, the region at the periphery of the light-emitting area 100, in other words, the frame region, is made larger. Further, when the width is less than 0.1 mm, a crack can easily develop, so that the luminance of the organic light-emitting device is reduced as described later.

A lower electrode 6 was formed at each pixel location in the light-emitting area 100. The external connection terminal 10 was formed outside the light-emitting area 100. The lower electrode 6 is electrically connected to a signal line 11 of the thin-film transistor via a contact hole formed through the insulating layer 3 and the organic planarization layer 4. The external connection terminal 10 is electrically connected directly to the signal line 11 of the thin-film transistor with the insulating layer 3 and the organic planarization layer 4 being removed at the portion.

As the material of the lower electrode 6 and the external connection terminal 10, for example, chromium can be used, but a silver film, a silver film including an additive, an aluminum film, an aluminum film including an additive, or an aluminum alloy film may also be used.

A pixel separation film 5 was formed so as to cover the peripheral portion of the lower electrode 6. As the material of the pixel separation film 5, an inorganic insulating layer formed of silicon nitride, silicon oxynitride, silicon oxide, or the like, an acrylic resin, a polyimide resin, a novolac resin, or the like may be used.

An organic compound layer 7 was formed on the lower electrode 6. The organic compound layer 7 includes a hole transport layer, a light-emitting layer, and an electron transport layer, for example, but may include only a light-emitting layer. Alternatively, the organic compound layer 7 may include a plurality of layers such as two layers and four layers.

An upper electrode 8 was formed on the organic compound layer 7. As the upper electrode 8, a transparent conductive oxide film formed of indium zinc oxide (IZO), indium tin oxide (ITO), or the like or a translucent metal film formed of silver, aluminum, gold, or the like may be used.

The region including the light-emitting area 100 having the organic light-emitting device and the region including the external connection terminal 10 on the substrate 1 were covered with the passivation layer 9. More specifically, without covering the region including the external connection terminal 10 with an area mask, the passivation layer 9 was formed entirely on the substrate 1.

As the material of the passivation layer 9, any material having denseness can be used including, for example, silicon nitride, silicon oxide, and silicon oxynitride.

The passivation layer 9 in the region including the external connection terminal 10 was peeled to be removed. Because the film density of the passivation layer 9 formed within the discontinuous portion 14 is low at the lower ends of the side walls (corners), the continuity of the passivation layer 9 is broken there. Therefore, a crack or the like produced when removing the passivation layer 9 on the external connection terminal 10 is blocked by the discontinuous portion 14 and does not reach the light-emitting area 100. Accordingly, the moisture resistance of the light-emitting area 100 is not impaired.

The method of peeling the passivation layer 9 is not specifically limited, and a method in which the region including the external connection terminal 10 is covered with a masking tape in advance and the passivation layer 9 is peeled together with the masking tape may be used. Alternatively, a method in which the passivation layer is photoetched with ultraviolet light or a method in which a laser elimination layer is formed in advance in the region including the external connection terminal 10 and the passivation layer 9 is removed together with the laser elimination layer may be used. In this embodiment, because the discontinuous portion 14 is formed in a line and the region including the external connection terminal 10 is rectangular, the passivation layer 9 can be easily peeled off.

A circularly polarizing plate 13 was bonded to the region including the light-emitting area 100, more specifically, on the passivation layer 9, by use of an adhesive 12. The circularly polarizing plate 13 is, similarly to an ordinary circularly polarizing plate, structured to be a combination of a polarizing plate and a ¼λ plate (phase plate).

As a result, an organic light-emitting apparatus can be obtained in which a recess which forms the discontinuous portion 14 for separating the region including the light-emitting area 100 and the region including the external connection terminal 10 is formed in a line in the organic planarization layer 4, and the discontinuous portion 14 is covered with the passivation layer 9. Because, even if cracking or the like produced when peeling the passivation layer 9 on the external connection terminal 10 develops with the elapse of time, the cracking or the like is blocked by the discontinuous portion 14, the moisture resistance of the light-emitting area 100 can be maintained.

Embodiment 2

Figure 3:
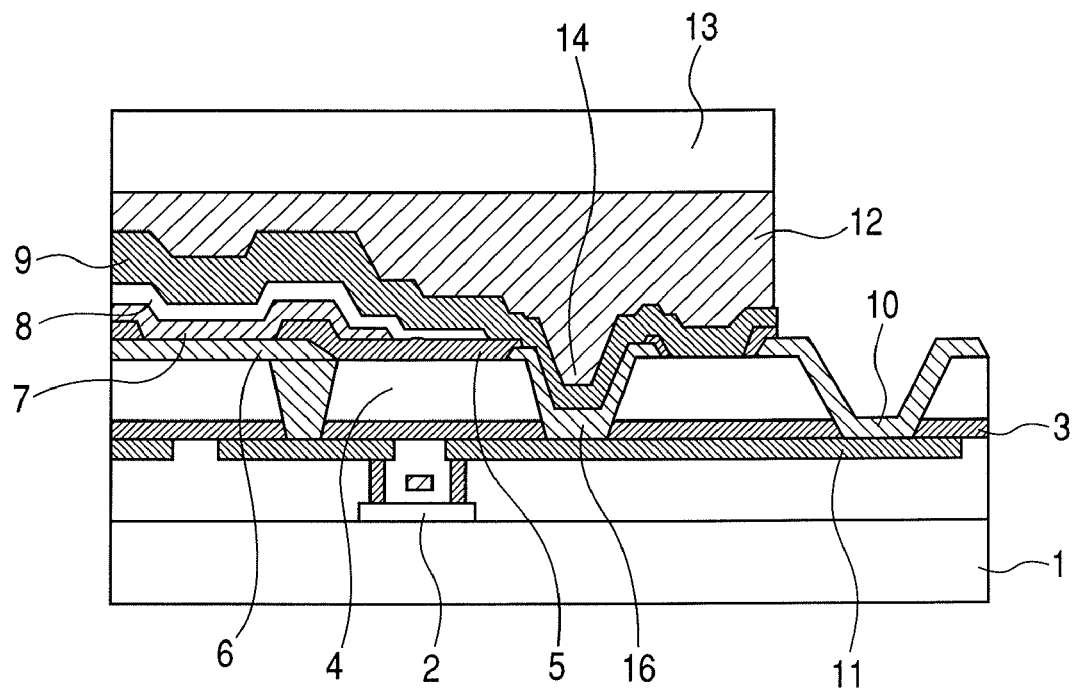
FIG. 3 is a schematic cross-sectional view of another embodiment of the organic light-emitting apparatus according to the present invention.

While, in Embodiment 1 described above, the passivation layer 9 was formed directly on the discontinuous portion 14, as illustrated in FIG. 3, an inorganic layer 16 may be formed in the discontinuous portion 14 and the passivation layer 9 may be formed on the inorganic layer 16.

More specifically, when, for example, the upper electrode 8 was formed, a metal oxide conductive film of ITO, IZO, or the like which had the same composition as that of the upper electrode 8 was formed also in the discontinuous portion 14. By adopting such a configuration, the contact area between the side wall and its vicinity of the discontinuous portion 14 and the passivation layer 9 can be increased, so that the passivation layer 9 can be more closely contacted. In addition, because the adhesion between a metal oxide conductor which is a metal compound and the passivation layer is high, and because the coefficient of thermal expansion of the metal oxide conductor is far closer to that of the passivation layer compared with an organic material, cracking of the passivation layer can be blocked.

Further, because the inorganic layer on the discontinuous portion 14 is independently formed, that is, because the inorganic layer is not formed extending over the light-emitting area 100, intrusion of moisture into the light-emitting area 100 can be prevented more reliability.

Embodiment 3

Figure 4:
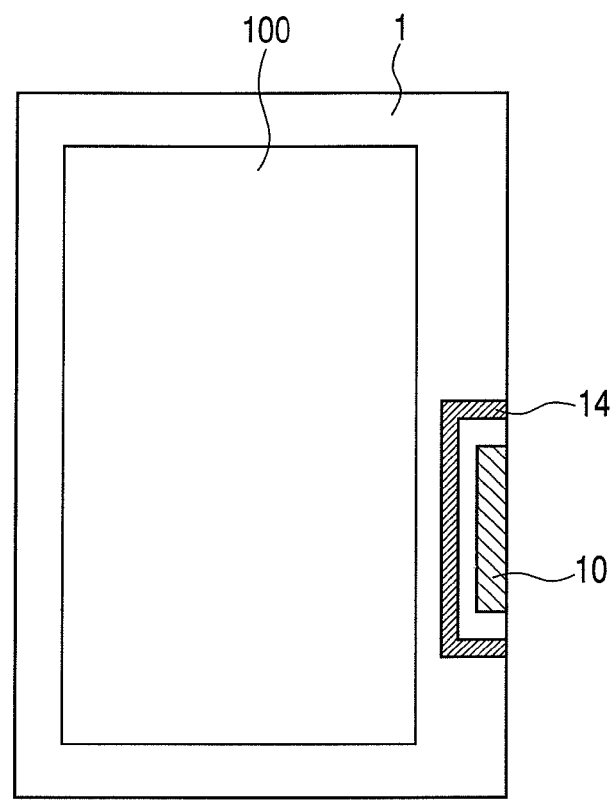
FIG. 4 is a schematic plan view of still another embodiment of the organic light-emitting apparatus according to the present invention.

While, in Embodiments 1 and 2 above, the discontinuous portion 14 was formed in a line so as to separate the region including the light-emitting area 100 and the region including the external connection terminal 10, as illustrated in FIG. 4, the discontinuous portion 14 may be formed so as to surround the region including the external connection terminal 10. In this case, the area of the region including the external connection terminal 10 can be made minimum and waste produced when peeling the passivation layer 9 can be reduced. Further, because the development of cracking can be further suppressed, the sealing performance can be improved.

Embodiment 4

Figure 5:
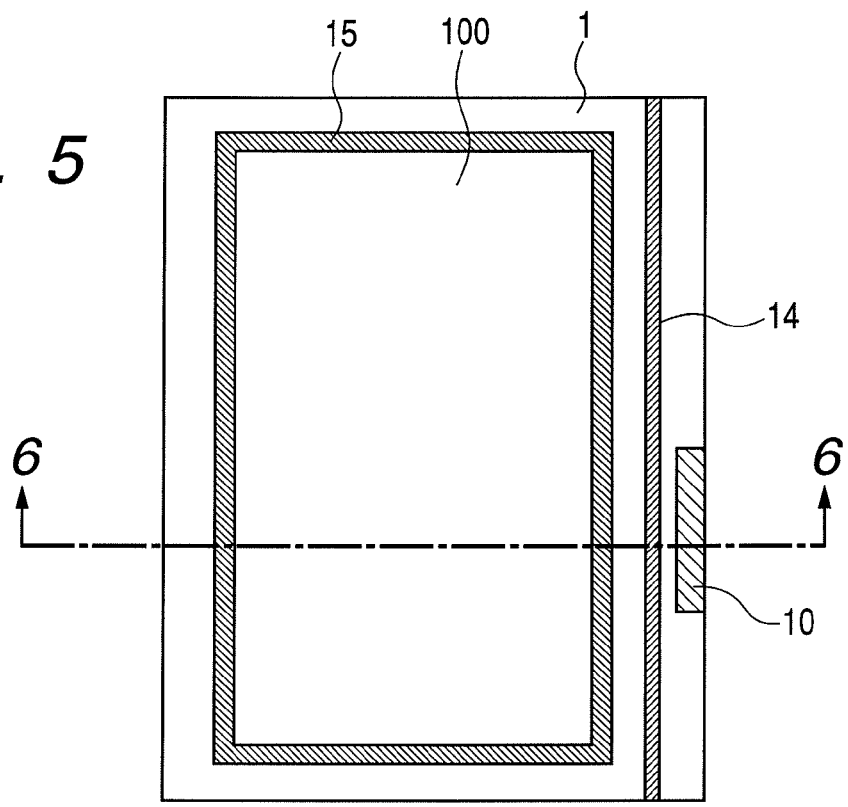
FIG. 5 is a schematic plan view of yet another embodiment of the organic light-emitting apparatus according to the present invention.
Figure 6:
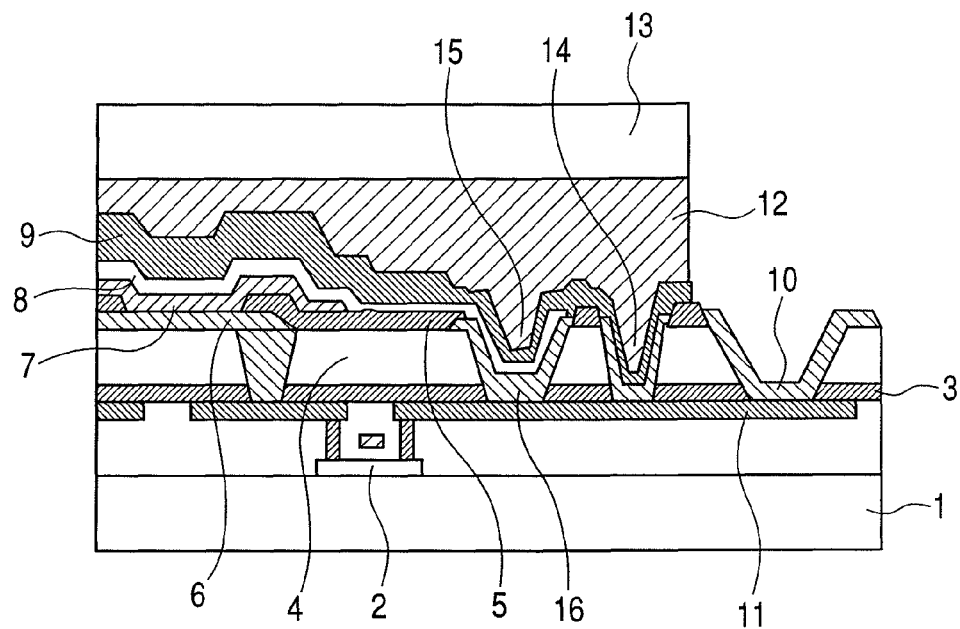
FIG. 6 is a schematic partial cross-sectional view taken along line 6-6 of FIG. 5.

While, in Embodiments 1 to 3 above, only the discontinuous portion 14 was formed to separate the region including the external connection terminal 10 and the region including the light-emitting area 100, as illustrated in FIGS. 5 and 6, a discontinuous portion 15 for blocking moisture may be additionally formed.

More specifically, the organic planarization layer 4, the pixel separation film 5, and the insulating layer 3 were removed to form the discontinuous portion 15 for blocking moisture on the light-emitting area 100 side with respect to the discontinuous portion 14 so as to surround the light-emitting area 100. A film of a material which has the same composition as that of the lower electrode 6 was formed in the discontinuous portion 15 so as to be electrically isolated from the lower electrode 6, and the upper electrode 8 was further formed thereon. The upper electrode 8 may be connected via a through hole (not shown) formed in the discontinuous portion 15 to a substrate circuit (not shown). Then, the passivation layer 9 was formed thereon.

In the above-mentioned structure, because the discontinuous portion 15 does not have a layer including an organic material, and because the inorganic layer 16 is in close contact with the upper electrode 8, intrusion of moisture contained in the organic planarization layer 4 outside the light-emitting area 100 can be blocked by the discontinuous portion 15. Therefore, the moisture resistance of the light-emitting area 100 can be further improved.

Embodiment 5

Figure 7:
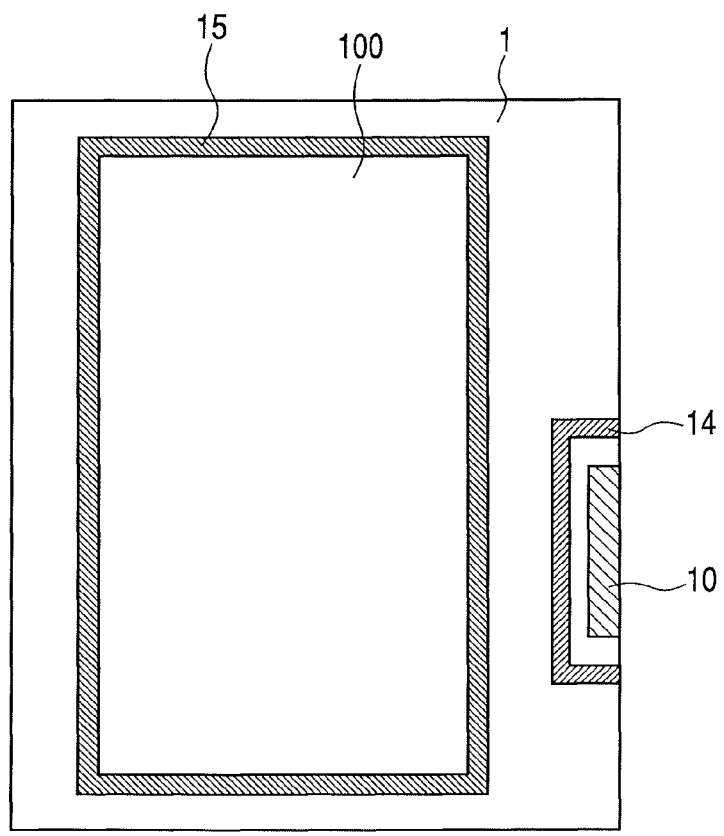
FIG. 7 is a schematic plan view of still another embodiment of the organic light-emitting apparatus according to the present invention.

While, in Embodiment 4 above, the discontinuous portion 14 is formed in a line so as to separate the region including the external connection terminal 10 and the region including the light-emitting area 100, as illustrated in FIG. 7, the discontinuous portion 14 may be formed so as to surround the region including the external connection terminal 10.

Embodiment 6

Figure 8:
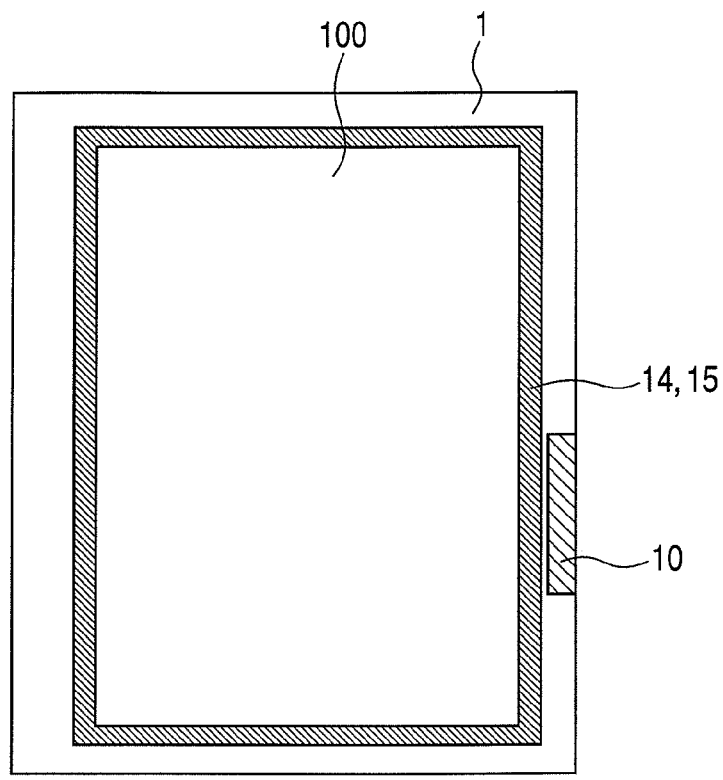
FIG. 8 is a schematic plan view of yet another embodiment of the organic light-emitting apparatus according to the present invention.

While, in Embodiments 4 and 5 above, the discontinuous portions 14 and 15 are individually provided, as illustrated in FIG. 8, the discontinuous portions 14 and 15 may be integrally formed.

Embodiment 7

Figure 9:
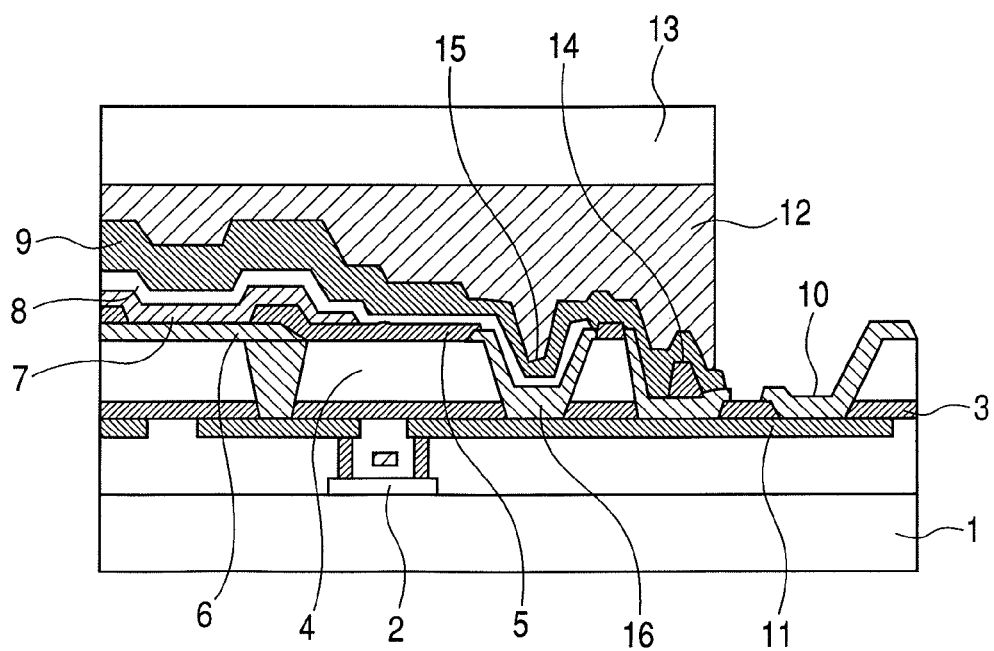
FIG. 9 is a schematic sectional view of still another embodiment of the organic light-emitting apparatus according to the present invention.

While, in Embodiments 1 to 6 above, the discontinuous portion 14 (15) is formed in a recess shape, as illustrated in FIG. 9, the discontinuous portion 14 (15) may be formed in a protrusion shape. Here, the discontinuous portion 14 is formed at a location which is set to separate the region including the light-emitting area 100 and the region including the external connection terminal 10, for example, concurrently with the formation of the upper electrode 8, by using a material having the same composition as that of the upper electrode 8. Alternatively, the discontinuous portion 14 is formed at a location which is set to separate the region including the light-emitting area 100 and the region including the external connection terminal 10, for example, concurrently with the formation of the pixel separation film 5, by using a material having the same composition as that of the pixel separation film 5. Alternatively, the discontinuous portion 14 may be formed by stacking a layer of a material having the same composition as that of the upper electrode 8 and a layer of a material having the same composition as that of the pixel separation film 5.

The height of the discontinuous portion 14 is desirably 0.3 μm or more, and more effectively 1 μm or more. The reason is that the higher the discontinuous portion 14, the deeper, in the film thickness direction, a fault plane produced due to difference in growth direction of the passivation layer 9 between the inclined surfaces and the bottom of the protrusion shape, so that the continuity of the passivation layer 9 can be broken more easily.

It is desirable that the side walls of the discontinuous portion 14 are tapered toward the bottom such that the distance between the opposing side walls is increased toward the bottom, and the angle (angle of inclination) is 30° or more. The reason is that when the angle is 30° or more, the film density of the passivation layer 9 in the lower portions of the side walls of the discontinuous portion 14, that is, at the corners of the discontinuous portion 14, can be reduced, whereby the continuity of the passivation layer 9 can be broken. Further, when the angle of the side walls of the discontinuous portion 14 is steep, the region at the periphery of the light-emitting area 100, in other words, the frame region, can be made smaller.

It is desirable that the width of the bottom of the discontinuous portion 14 is 0.1 mm or more and 0.5 mm or less. When the width is more than 0.5 mm, the region at the periphery of the light-emitting area 100, in other words, the frame region, is made larger. Further, when the width is less than 0.1 mm, the luminance of the organic light-emitting device is reduced as described later.

Incidentally, although, in this embodiment, a recess is formed in the organic planarization layer 4 and the discontinuous portion 14 is formed on the inorganic layer formed in the recess, the protrusion may be directly formed as the discontinuous portion 14 without forming the recess in the organic planarization layer 4.

Embodiment 8

Although, in Embodiments 1 to 7, the recess in the discontinuous portion 14 is formed by removing the respective layers until the insulating layer 3 or the signal wiring 11 is exposed from the bottom of the recess, it may be sufficient that the thickness thereof is merely made smaller at that location.

EXAMPLES

Examples of the present invention are now described in the following.

Example 1

Figure 2:
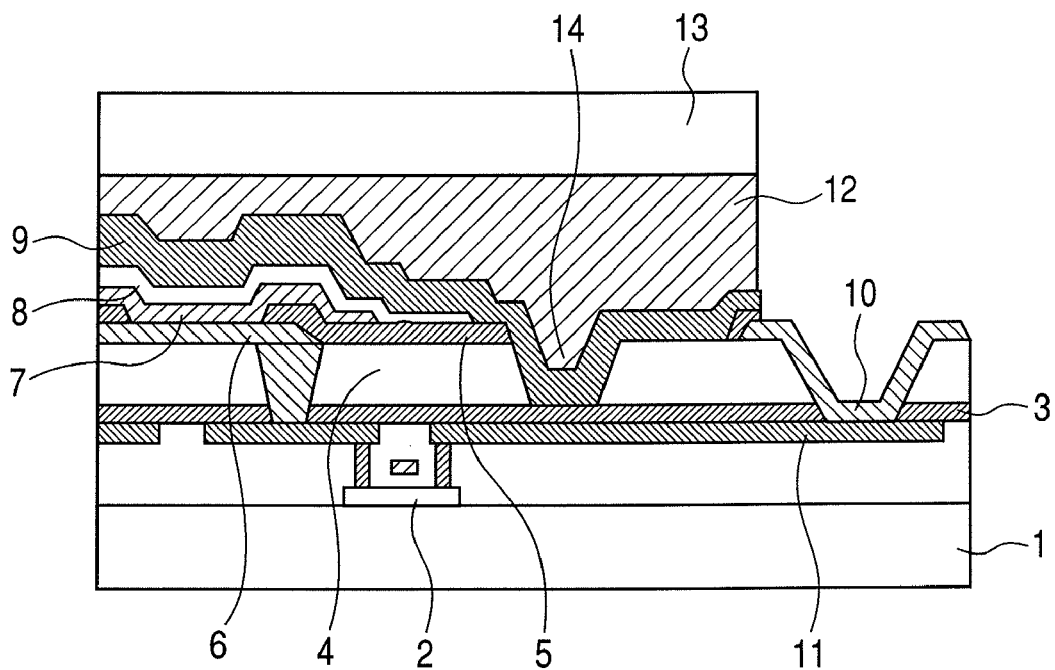
FIG. 2 is a schematic partial cross-sectional view taken along line 2-2 of FIG. 1.

FIG. 1 is a plan view of an organic light-emitting apparatus of Example 1 and FIG. 2 is a partial cross-sectional view taken along line 2-2 of FIG. 1.

The organic light-emitting apparatus illustrated in FIG. 1 was formed by stacking on the glass substrate 1, the TFTs 2, the insulating layer 3, and the organic planarization layer 4 in the mentioned order. The lower electrode 6 of aluminum (Al)/indium tin oxide (ITO) was formed on the organic planarization layer 4 in a thickness of 150 nm for each pixel. The periphery of each pixel was covered with the pixel separation film 5 of a polyimide.

The discontinuous portion 14 as a structure for preventing cracking of the passivation layer 9 was formed between the external connection terminal 10 and the light-emitting area 100 in the organic planarization layer 4. The discontinuous portion 14 was a recess formed by removing the organic planarization layer 4 on the substrate. The width of the bottom of the discontinuous portion 14 was 0.5 mm. The insulating layer 3 formed of an inorganic material was exposed from the bottom thereof.

The TFT substrate structured as described above was cleaned for about 5 minutes, and was then dehydrated by baking at about 200° C. for two hours. After that, the lower electrode 6 was cleaned with UV/ozone.

Then, the organic compound layer 7 composed of a hole transport layer, a light-emitting layer, an electron transport layer, and an electron injection layer was formed on the lower electrode 6. Here, the organic compound layer 7 was formed also on the external connection terminal 10.

More specifically, the substrate and the material were set in a vacuum evaporator, and N,N'-α-dinaphthylbenzidine (α-NPD) was formed into a film of a thickness of 40 nm on the lower electrode 6 under the condition of $1 \times 10^{-3}$ Pa to thereby form the hole transport layer.

A coevaporation film of coumarin dye (1.0 vol %) which is known to emit green light and tris-[8-hydroxyquinolinate] aluminum (Alq3) was formed in a thickness of 30 nm on the hole transport layer to thereby form the light-emitting layer.

Then, as the electron transport layer, a film of a phenanthroline compound represented by the formula:

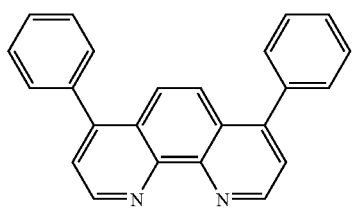

was formed in a thickness of 10 nm.

Then, a coevaporation film of cesium carbonate (2.9 vol %) and the phenanthroline compound represented by the above formula was formed in a thickness of 40 nm on the electron transport layer to thereby form the electron injection layer.

Next, the substrate having the layers up to and including the electron injection layer formed thereon was transferred to a separate sputtering apparatus, where a film of indium tin oxide (ITO) was formed by sputtering on the electron injection layer in a thickness of 60 nm to thereby form the upper electrode 8.

Then, the passivation layer 9 was formed by VHF plasma CVD on substantially entirely on the substrate 1 so as to cover the above-mentioned layers.

More specifically, first, the TFT substrate having the layers up to and including the upper electrode 8 formed thereon was fixed to a substrate holder including a high-frequency electrode for a deposited film forming apparatus and a substrate holder also serving as a ground electrode opposed thereto, and a vacuum vessel was temporarily vacuumed so as to be on the order of $1-10^{-3}$ Pa. After that, $SiH_4$ gas, $N_2$ gas, and $H_2$ gas were made to flow into the vacuum vessel and the pressure inside a reaction space was controlled. Then, a 60 MHz high-frequency power was supplied to the high-frequency electrode to form the passivation layer in a thickness of about 3 μm by deposition.

After that, a laser beam was irradiated onto the external connection terminal 10, and the passivation layer 9 on the external connection terminal 10 was peeled to be removed together with the organic compound layer 7.

The circularly polarizing plate 13 was bonded to the passivation layer 9 with the adhesive 12 to obtain the organic light-emitting apparatus.

Ten organic light-emitting apparatus were produced in the similar manner.

The passivation layer 9 on the external connection terminal 10 was observed with an optical microscope to make observations of cracking or the like of the passivation layer 9. The results are shown in Table 1.

TABLE 1

| | Substrate No. | | | | | | | | | |
|---|---|---|---|---|---|---|---|---|---|---|
| | 1 | 2 | 3 | 4 | 5 | 6 | 7 | 8 | 9 | 10 |
| Outside light-emitting area | o | o | o | Δ | Δ | o | Δ | o | Δ | o |
| Within light-emitting area | o | o | o | o | o | o | o | o | o | o |

Note:
o means that no cracks, chips, and film peeling were observed; and
Δ means that a small crack, a small chip, or small film peeling was observed.

An accelerated test was done on the organic light-emitting apparatus under the conditions of 60° C. and 90% RH for 500 hours. The state of the crack or the like in the passivation layer 9 after the accelerated test was observed. The results are shown in Table 2.

TABLE 2

| | Substrate No. | | | | | | | | | |
|---|---|---|---|---|---|---|---|---|---|---|
| | 1 | 2 | 3 | 4 | 5 | 6 | 7 | 8 | 9 | 10 |
| Outside light-emitting area | o | o | o | x | Δ | o | Δ | o | x | o |
| Within light-emitting area | o | o | o | o | o | o | o | o | o | o |

Note:
o means that no cracks, chips, and film peeling were observed;
Δ means that a small crack, a small chip, or small film peeling was observed; and
x for the outside of light-emitting area means that a crack, a chip, or film peeling which reached the discontinuous portion 14 was observed.

Before the accelerated test, four organic light-emitting apparatus out of the ten were observed to have small film peeling of the passivation layer 9, and a crack or a chip on the order of several μm in a cut portion of the passivation layer 9 to which the laser beam was irradiated.

After the accelerated test under the conditions of 60° C. and 90% RH for 500 hours, cracks developed in two organic light-emitting apparatus among the four, but the cracks were blocked by the discontinuous portion 14.

Example 2

In Example 2, as illustrated in FIG. 3, a TFT substrate having a metal compound layer of indium tin oxide (ITO) formed in the discontinuous portion 14 thereof was used. The width of the bottom of the discontinuous portion 14 of FIG. 3 was, similarly to that of Example 1, 0.5 mm. Similarly to the case of Example 1, an organic light-emitting device was prepared, and the passivation layer 9 in a thickness of about 6 μm was formed by deposition to seal the organic light-emitting device.

After that, a laser beam was irradiated to the external connection terminal 10, and the passivation layer 9 on the external connection terminal 10 was peeled to be removed together with the organic compound layer 7.

The circularly polarizing plate 13 was bonded to the passivation layer 9 with the adhesive 12 to obtain the organic light-emitting apparatus.

Ten organic light-emitting apparatus were produced in the similar manner.

An accelerated test was done on the organic light-emitting apparatus under the conditions of 60° C. and 90% RH for 500 hours. The state of the crack or the like in the passivation layer 9 after the accelerated test was observed. The results are shown in Table 3.

TABLE 3

| | Substrate No. | | | | | | | | | |
|---|---|---|---|---|---|---|---|---|---|---|
| | 1 | 2 | 3 | 4 | 5 | 6 | 7 | 8 | 9 | 10 |
| Outside light-emitting | x | Δ | o | x | o | o | Δ | o | Δ | x |

TABLE 3-continued

| | Substrate No. | | | | | | | | | |
|---|---|---|---|---|---|---|---|---|---|---|
| | 1 | 2 | 3 | 4 | 5 | 6 | 7 | 8 | 9 | 10 |
| area | | | | | | | | | | |
| Within light-emitting area | o | o | o | o | o | o | o | o | o | o |

Note:
o, Δ, and x mean the same as in Notes of Tables 1 and 2.

After the accelerated test under the conditions of 60° C. and 90% RH for 500 hours, cracks produced outside the light-emitting area 100 were blocked by the discontinuous portion 14 and none of the cracks developed into the light-emitting area 100.

Example 3

In Example 3, as illustrated in FIG. 4, the discontinuous portion 14 was formed so as to surround the external connection terminal 10, and a TFT substrate having a metal compound layer of indium tin oxide (ITO) formed in the discontinuous portion 14 thereof was used. The width of the bottom of the discontinuous portion 14 was, similarly to the ones in Examples 1 and 2, 0.5 mm. Similarly to the case of Example 1, an organic light-emitting device was prepared, and the passivation layer 9 in a thickness of about 3 μm was formed by deposition to seal the organic light-emitting device.

After that, a laser beam was irradiated to the external connection terminal 10, and the passivation layer 9 on the external connection terminal 10 was peeled to be removed together with the organic compound layer 7.

The circularly polarizing plate 13 was bonded to the passivation layer 9 with the adhesive 12 to obtain the organic light-emitting apparatus.

Ten organic light-emitting apparatuses were produced similarly.

An accelerated test was done on the organic light-emitting apparatus under the conditions of 60° C. and 90% RH for 500 hours. The state of the crack or the like in the passivation layer 9 after the accelerated test was observed. The results are shown in Table 4.

TABLE 4

| | Substrate No. | | | | | | | | | |
|---|---|---|---|---|---|---|---|---|---|---|
| | 1 | 2 | 3 | 4 | 5 | 6 | 7 | 8 | 9 | 10 |
| Outside light-emitting area | Δ | x | o | Δ | Δ | o | Δ | x | o | Δ |
| Within light-emitting area | o | o | o | o | o | o | o | o | o | o |

Note:
o, Δ, and x mean the same as in Notes of Tables 1 and 2.

After the accelerated test under the conditions of 60° C. and 90% RH for 500 hours, cracks produced outside the light-emitting area 100 were blocked by the discontinuous portion 14 and none of them developed into the light-emitting area 100.

Example 4

In Example 4, as illustrated in FIG. 1, the discontinuous portion 14 was formed and a substrate having a structure in which a metal compound layer of ITO was exposed at the bottom of the discontinuous portion 14 was used. Similarly to the case of Example 1, an organic light-emitting device was prepared, and the passivation layer 9 in a thickness of about 6 μm was formed by deposition to seal the organic light-emitting device.

After that, a laser beam was irradiated to the external connection terminal 10, and the passivation layer 9 on the external connection terminal 10 was peeled to be removed together with the organic compound layer 7. Further, a crack was produced in the passivation layer 9 by a laser beam. In this way, ten organic light-emitting apparatuses were, respectively, produced with the width of the bottom of the discontinuous portion 14 being gradually changed from 0.025 mm to 0.5 mm as shown in Table 5.

An accelerated test was done on the respective organic light-emitting apparatuses under the conditions of 60° C. and 90% RH for 500 hours. Whether the crack in the passivation layer 9 went beyond the discontinuous portion 14 to reach the light-emitting area 100 or not after the accelerated test was observed. Further, display using the organic light-emitting device was carried out and whether the luminance was reduced in the vicinity of the external connection terminal 10 of the organic light-emitting device or not was observed. In the evaluation, o was given when the rate of reduction of the luminance with respect to the initial luminance was 5% or less and x was given when the rate was more than 5%. The results are shown in Table 5.

TABLE 5

| | Substrate No. | | | | | | | | | |
|---|---|---|---|---|---|---|---|---|---|---|
| | 1 | 2 | 3 | 4 | 5 | 6 | 7 | 8 | 9 | 10 |
| Groove width 0.025 mm | x | o | o | o | o | o | o | o | x | o |
| Groove width 0.05 mm | o | o | o | o | o | o | o | x | o | o |
| Groove width 0.1 mm | o | o | o | o | o | o | o | o | o | o |
| Groove width 0.2 mm | o | o | o | o | o | o | o | o | o | o |
| Groove width 0.5 mm | o | o | o | o | o | o | o | o | o | o |

Note:
o means that the luminance was not reduced; and
x means that the luminance was reduced by 5% or more.

After the accelerated test under the conditions of 60° C. and 90% RH for 500 hours, the cracks were blocked for all the organic light-emitting apparatuses having a width of 0.025 mm to 0.5 mm. However, the luminance was reduced by 5% or more for two of the organic light-emitting apparatuses having a width of 0.025 mm and one of the organic light-emitting apparatuses having a width of 0.05 mm. The luminance was not reduced for all the organic light-emitting apparatuses having a width of 0.1 mm to 0.5 mm.

As described above, the luminance is more liable to be reduced when the width of the bottom of the discontinuous portion 14 is small. However, by forming the discontinuous portion 14, development of a crack into the passivation layer 9 in the light-emitting area 100 can be blocked and intrusion of moisture or oxygen into the light-emitting area 100 can be prevented.

Further, the metal compound exposed at the bottom of the discontinuous portion 14 is not limited to indium tin oxide (ITO). An inorganic material such as silicon nitride, silicon oxynitride, silicon oxide, aluminum oxide, indium zinc oxide (IZO), indium tin zinc oxide (ITZO), or the like can also effectively be used.

Comparative Example

In this comparative example, a TFT substrate having no discontinuous portion was used. Similarly to the case of Example 1 above, an organic light-emitting device was formed, and a passivation layer in a thickness of about 6 μm was formed by deposition to seal the organic light-emitting device.

After that, a laser beam was irradiated to an external connection terminal, and the passivation layer on the external connection terminal was peeled to be removed together with an organic compound layer.

A circularly polarizing plate was bonded to the passivation layer with an adhesive to obtain an organic light-emitting apparatus.

Ten organic light-emitting apparatuses were produced similarly.

The passivation layer on the external connection terminal 10 was observed under an optical microscope to make observations of a crack and the like in the passivation layer. After that, an accelerated test was done under the conditions of 60° C. and 90% RH for 500 hours. The state of the crack or the like in the passivation layer after the accelerated test was observed. The results are shown in Table 6.

TABLE 6

| | \multicolumn{10}{c}{Substrate No.} | | | | | | | | | |
|---|---|---|---|---|---|---|---|---|---|---|
| | 1 | 2 | 3 | 4 | 5 | 6 | 7 | 8 | 9 | 10 |
| Outside light-emitting area | ○ | x | x | Δ | ○ | x | Δ | x | x | Δ |
| Within light-emitting area | ○ | x | x | ○ | ○ | x | ○ | x | x | ○ |

Note:
○ means that no cracks, chips, and film peeling were observed;
Δ means that a small crack, a small chip, or small film peeling was observed;
x for the outside of the light-emitting area means that a crack, a chip, or film peeling which reached the discontinuous portion was observed; and
x for the inside of the light-emitting area means that a crack inside the light emitting area was observed.

After the accelerated test under the conditions of 60° C. and 90% RH for 500 hours, cracks developed and reached the light-emitting area in five organic light-emitting apparatuses among the ten. When light was emitted, some pixels did not emit light in the vicinity of the external connection terminal in the light-emitting area.

The organic light-emitting apparatus according to the present invention can be suitably used as a display apparatus, and, in particular, suitably used for a television receiver, a display portion of a mobile phone, and a display portion of an imaging apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-189172, filed Jul. 20, 2007 and No. 2008-158961, filed Jun. 18, 2008, which are hereby incorporated by reference herein in their entirety.

What is claimed is:

1. A method of producing an organic light-emitting apparatus comprising a substrate, an organic planarization layer for planarizing unevenness of the substrate, an organic light-emitting device, an external connection terminal, and a passivation layer for covering the organic light-emitting device, the method comprising the steps of:
   forming, in an organic planarization layer on a substrate, a recessed or protruding discontinuous portion to separate a region including a light-emitting area and a region including the external connection terminal;
   covering the region including the light-emitting area and the region including the external connection terminal on the substrate, with a passivation layer, wherein the passivation layer covering the region including the light-emitting area and the passivation layer covering the region including the external connection terminal are connected to each other over the discontinuous portion; and
   peeling the passivation layer on the external connection terminal.

2. A method of producing an organic light-emitting apparatus according to claim 1, wherein the passivation layer is formed by a CVD process.

* * * * *